(12) United States Patent
Wang et al.

(10) Patent No.: US 11,366,020 B2
(45) Date of Patent: Jun. 21, 2022

(54) TEMPERATURE SENSOR, ARRAY SUBSTRATE, DISPLAY APPARATUS AND VOLTAGE ADJUSTMENT METHOD

(71) Applicant: BOE Technology Group Co., Ltd., Beijing (CN)

(72) Inventors: Haisheng Wang, Beijing (CN); Xue Dong, Beijing (CN); Jing Lv, Beijing (CN); Xiaochuan Chen, Beijing (CN); Chunwei Wu, Beijing (CN); Yingming Liu, Beijing (CN); Xiaoliang Ding, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 1086 days.

(21) Appl. No.: 15/772,877

(22) PCT Filed: Sep. 15, 2017

(86) PCT No.: PCT/CN2017/101870
§ 371 (c)(1),
(2) Date: May 2, 2018

(87) PCT Pub. No.: WO2018/149124
PCT Pub. Date: Aug. 23, 2018

(65) Prior Publication Data
US 2020/0256741 A1    Aug. 13, 2020

(30) Foreign Application Priority Data

Feb. 16, 2017  (CN) .......................... 201710084940.7

(51) Int. Cl.
*G01K 7/01* (2006.01)
*G09G 3/00* (2006.01)
(Continued)

(52) U.S. Cl.
CPC ............... *G01K 7/01* (2013.01); *G09G 3/006* (2013.01); *H03L 1/00* (2013.01); *H03L 1/02* (2013.01); *H03L 1/022* (2013.01)

(58) Field of Classification Search
CPC ........................................................ G01K 7/01
(Continued)

(56) References Cited

U.S. PATENT DOCUMENTS 6,163,225 A * 12/2000 Sundaram ................ H03B 5/04
331/111
2006/0033697 A1    2/2006 Yang

FOREIGN PATENT DOCUMENTS

CN    103377606 A    10/2013
CN    103684354 A    3/2014
(Continued)

OTHER PUBLICATIONS

International Search Report and Written Opinion, including English translation of Box V of the Written Opinion, for International Application No. PCT/CN2017/101870, dated Nov. 23, 2017, 17 pages.

(Continued)

*Primary Examiner* — Joseph Chang
(74) *Attorney, Agent, or Firm* — Westman, Champlin & Koehler, P.A.

(57) ABSTRACT

According to the embodiments of the present disclosure, there is provided a sensor for detecting a temperature. The sensor comprises a switch circuit; a charge/discharge circuit connected to the switch circuit, and configured to be charged and discharged under control of the switch circuit; a sensing circuit connected to the charge/discharge circuit, and configured to cause a charge/discharge period of the charge/discharge circuit to change with a temperature of the sensing circuit; and an oscillation circuit connected to the switch (Continued)

circuit and the charge/discharge circuit, and configured to generate, under action of the charge/discharge circuit, an oscillation signal for controlling the switch circuit, wherein an oscillation frequency of the oscillation signal is dependent on the charge/discharge period and thus indicates the temperature of the sensing circuit. In addition, the embodiments of the present disclosure further provide an array substrate and display comprising the sensor, and a corresponding voltage adjustment method.

19 Claims, 4 Drawing Sheets

(51) Int. Cl.
*H03L 1/00* (2006.01)
*H03L 1/02* (2006.01)

(58) Field of Classification Search
USPC .......................................................... 331/66
See application file for complete search history.

(56) References Cited

FOREIGN PATENT DOCUMENTS

| | | |
|---|---|---|
| CN | 104596659 A | 5/2015 |
| CN | 106023890 A | 10/2016 |
| CN | 106840432 A | 6/2017 |
| KR | 20080060374 A | 7/2008 |

OTHER PUBLICATIONS

First Office Action, including Search Report, for Chinese Patent Application No. 201710084940.7, dated Nov. 27, 2017, 12 pages.

* cited by examiner

TEMPERATURE SENSOR, ARRAY SUBSTRATE, DISPLAY APPARATUS AND VOLTAGE ADJUSTMENT METHOD

CROSS-REFERENCE TO RELATED APPLICATION(S)

This application is a Section 371 National Stage application of International Application No. PCT/CN2017/101870, filed on 15 Sep. 2017, which has not yet published, and claims priority to Chinese Patent Application No. 201710084940.7, filed on Feb. 16, 2017, the contents of which are incorporated herein by reference in their entirety.

TECHNICAL FIELD

The present disclosure relates to the field of display, and more particularly, to a sensor for detecting a temperature, an array substrate and a display apparatus comprising the sensor, and a corresponding voltage adjustment method.

BACKGROUND

With the development of technology, liquid crystal displays have become an integral part of electronic devices which are used in daily life. The Thin Film Transistor (TFT) Liquid Crystal Display (TFT LCD) is one of Active Matrix type Liquid Crystal Displays (AM-LCDs). Liquid crystal flat panel displays (especially TFT LCDs) are currently the only display devices which comprehensively surpass and exceed Cathode Ray Tubes (CRTs) in terms of brightness, contrast, power consumption, lifetime, volume, and weight and the like. Such Liquid crystal flat panel displays have excellent performance and large-scale production characteristics, high degree of automation and low raw material cost, and therefore have a great prospect and will quickly become the mainstream products in the new century.

TFTs, which are the main elements of TFT LCDs, belong to a kind of special field effect transistors. The general production method thereof is to deposit various thin films such as a semiconductor active layer, a dielectric layer, and a metal electrode layer on a substrate so as to form a source, a drain and a gate of a transistor. Separate TFTs are provided for various pixels of a LCD, which can achieve individual switching control of the various pixels of the LCD. As a result, the TFT LCDs can display at a high speed with high brightness and high contrast.

SUMMARY

According to a first aspect of the present disclosure, there is provided a sensor for detecting a temperature, comprising: a switch circuit; a charge/discharge circuit connected to the switch circuit, and configured to be charged and discharged under control of the switch circuit; a sensing circuit connected to the charge/discharge circuit, and configured to cause a charge/discharge period of the charge/discharge circuit to change with a temperature of the sensing circuit; and an oscillation circuit connected to the switch circuit and the charge/discharge circuit, and configured to generate, under action of the charge/discharge circuit, an oscillation signal for controlling the switch circuit, wherein an oscillation frequency of the oscillation signal is dependent on the charge/discharge period and thus indicates the temperature of the sensing circuit.

In some embodiments, the switch circuit has an input terminal, an output terminal and a control terminal, the input terminal is connected to a power supply, the output terminal is connected to a first terminal of the charge/discharge circuit, a first terminal of the sensing circuit and an input terminal of the oscillation circuit, and a control terminal is connected to an output terminal of the oscillation circuit.

In some embodiments, the switch circuit at least comprises a thin film transistor.

In some embodiments, the oscillation circuit has an input terminal and an output terminal, the input terminal is connected to the output terminal of the switch circuit, the first terminal of the charge/discharge circuit and an input terminal of the sensing circuit, and the output terminal is connected to the control terminal of the switch circuit.

In some embodiments, the inverters are made of thin film transistors.

In some embodiments, the charge/discharge circuit has a first terminal and a second terminal, the first terminal is connected to the output terminal of the switch circuit, the input terminal of the oscillation circuit, and the first terminal of the sensing circuit, and the second terminal is connected to the ground.

In some embodiments, the charge/discharge circuit at least comprises a capacitor.

In some embodiments, the sensing circuit has a first terminal, a second terminal and a control terminal, the first terminal is connected to the output terminal of the switch circuit, the first terminal of the charge/discharge circuit, and the input terminal of the oscillation circuit, the second terminal is connected to the ground, and the control terminal is connected to a predetermined voltage.

In some embodiments, the sensing circuit at least comprises a thin film transistor.

In some embodiments, the predetermined voltage is between a turn-on voltage and a turn-off voltage of the thin film transistor.

In some embodiments, the sensor further comprises: a frequency detection circuit connected to the output terminal of the oscillation circuit, and configured to detect the oscillation frequency of the oscillation signal so as to determine the temperature.

According to a second aspect of the present disclosure, there is provided an array substrate. The array substrate comprises the temperature sensor according to the first aspect of the present disclosure.

According to a third aspect of the present disclosure, there is provided a display apparatus. The display apparatus comprising the temperature sensor according to the first aspect of the present disclosure.

According to a fourth aspect of the present disclosure, there is provided a method for adjusting a turn-on voltage and/or a turn-off voltage of a transistor. The method comprises: determining a temperature using the temperature sensor according to the first aspect of the present disclosure; determining an offset of a threshold voltage of the transistor according to the temperature; and adjusting the turn-on voltage and/or the turn-off voltage of the transistor according to the offset.

BRIEF DESCRIPTION OF THE DRAWINGS

The above and other purposes, features and advantages of the present disclosure will be more apparent from the following description of the preferred embodiments of the present disclosure with reference to the accompanying drawings, in which.

DETAILED DESCRIPTION

Hereinafter, preferred embodiments of the present disclosure will be described in detail with reference to the accompanying drawings, and details and functions which are unnecessary for the present disclosure are omitted in the description so as to prevent confusion of the understanding of the present disclosure. In the present specification, the following various embodiments for describing the principles of the present disclosure are illustrative only and should not be construed as limiting the scope of the present disclosure in any way. The following description with reference to the accompanying drawings is provided to assist in a comprehensive understanding of exemplary embodiments of the present disclosure as defined by the claims and their equivalents. The following description comprises various specific details to assist in that understanding but these details are to be regarded as merely exemplary. Accordingly, it should be recognized by those of ordinary skill in the art that various changes and modifications of the embodiments described herein can be made without departing from the scope and spirit of the present disclosure. In addition, descriptions of well-known functions and constructions are omitted for clarity and conciseness. Moreover, the same reference signs are used for the same or similar functions and operations throughout the accompanying drawings.

Hereinafter, the present disclosure is described in detail by taking a scenario where the present disclosure is applied to a TFT LCD display as an example. However, the present disclosure is not limited thereto, and the present disclosure may also be applied to other electronic devices. In fact, as long as the electronic devices use a TFT element and need to adjust an operating voltage of the TFT element according to a temperature, the solutions according to the embodiments of the present disclosure may be applied thereto.

In the present disclosure, the terms "include" and "including" and derivatives thereof are intended to be inclusive instead of limiting; and the terms "or" is inclusive, which means and/or.

Figure 1:
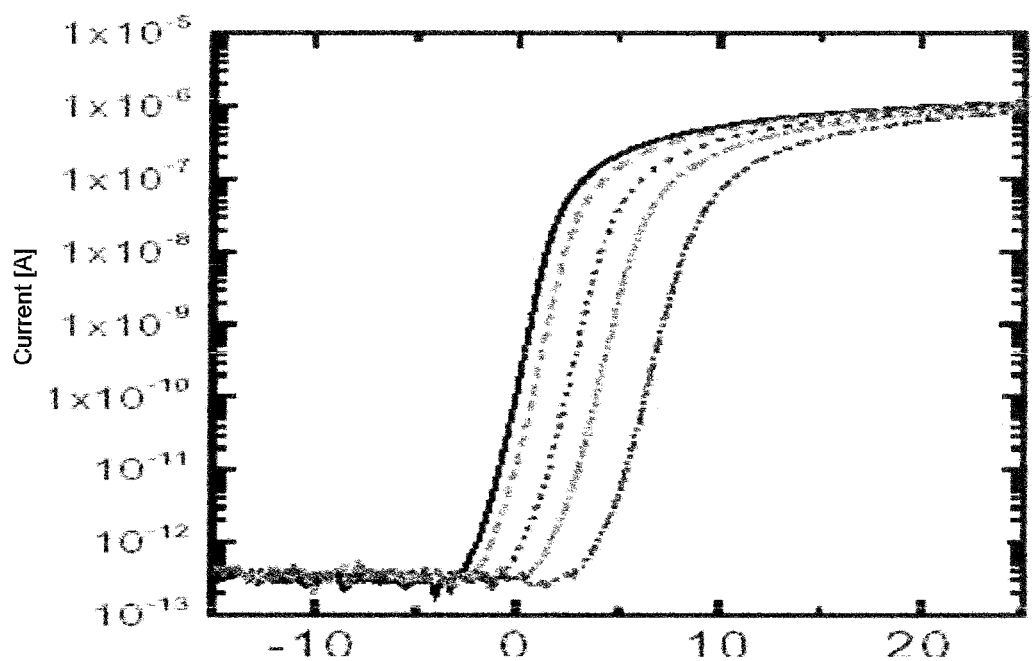
FIG. 1 is a diagram illustrating exemplary experimental data where a threshold voltage of a TFT changes with a temperature.

In related TFT processes, such as processes using amorphous silicon/Low Temperature Polysilicon (LTPS)/oxide and the like, there is usually a problem that a threshold voltage of a TFT shifts with a temperature. FIG. 1 illustrates exemplary experimental data where a threshold voltage of a TFT shifts with a temperature. In FIG. 1, the horizontal axis represents a gate-source voltage of the TFT, and the vertical axis represents source-drain current. It can be seen from FIG. 1 that, as the temperature gradually rises, voltage-current curves at different temperatures shift to the right as a whole, which means that the threshold voltage of the TFT rises with the temperature.

Figure 2:
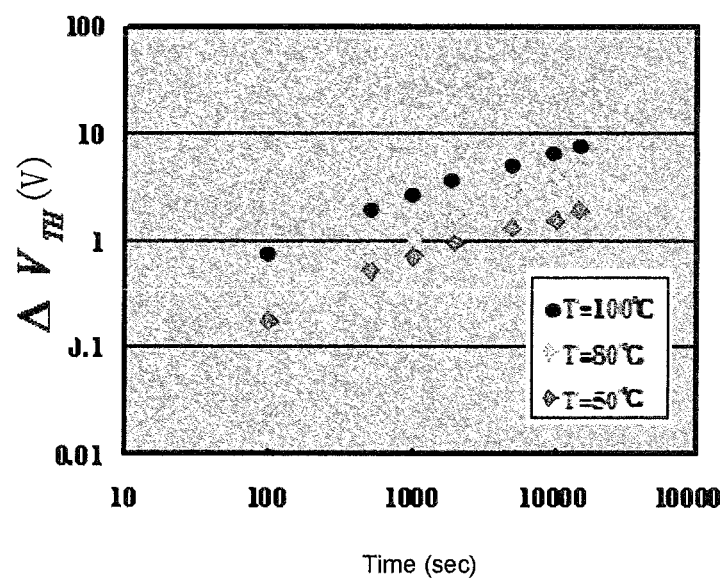
FIG. 2 is another diagram illustrating exemplary experimental data where a threshold voltage of a TFT changes with a temperature.

FIG. 2 illustrates another set of experimental data where a threshold voltage changes with a temperature by taking a TFT manufactured using an oxide process as an example. In FIG. 2, the horizontal axis represents time at a specified temperature, and the vertical axis represents an offset of a threshold voltage. It can be seen from FIG. 2 that the longer the time spent at the same temperature, the higher the offset of the threshold voltage; and for the same dwell time, the higher the temperature, the higher the offset of the threshold voltage.

In order to deal with the offset of the threshold voltage, a voltage range of a driving voltage (for example, a turn-on voltage ($V_{gh}$) and a turn-off voltage ($V_{gl}$)) of a TFT may generally be increased. For example, $V_{gh}$ may need to be equal to 8V and $V_{gl}$ may need to be equal to −8V at a normal temperature. In order to ensure that a change in the threshold voltage can be dealt with in a case of an increase or decrease in an ambient temperature, an actual $V_{gh}$ is generally set to 12V, and an actual $V_{gl}$ is generally set to −12V.

However, in such a case, although normal turn-on and turn-off of the TFT after the change in the temperature can be satisfied, the power consumption of the TFT is increased.

The embodiments of the present disclosure generally provide a temperature sensor, an array substrate and display apparatus comprising the temperature sensor, and a voltage adjustment method for controlling a turn-on voltage and/or a turn-off voltage of a transistor according to a temperature. The operating principle of the temperature sensor is basically that, a circuit which outputs an oscillation signal having an oscillation frequency corresponding to a temperature is designed according to the phenomenon that a threshold voltage of a TFT changes with the temperature. An exemplary temperature sensor according to an embodiment of the present disclosure will be described in detail below with reference to FIG. 3.

Figure 3:
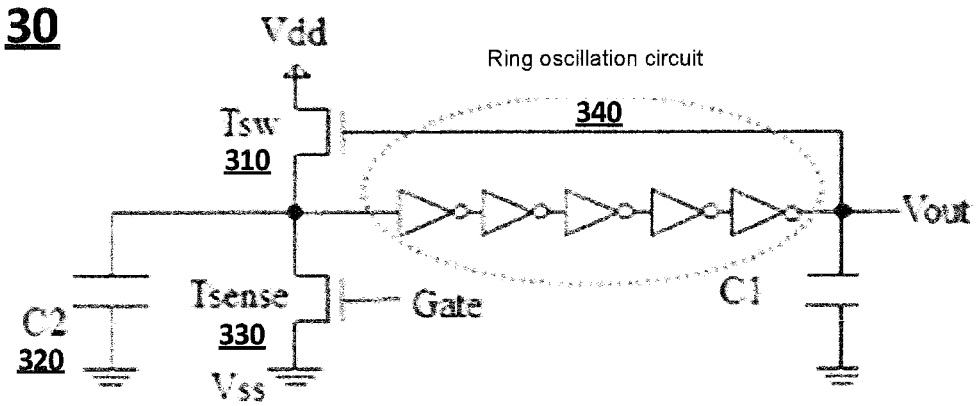
FIG. 3 is an exemplary schematic diagram illustrating a sensor for detecting a temperature according to an embodiment of the present disclosure.

FIG. 3 illustrates an exemplary schematic diagram of an exemplary temperature sensor 30 according to an embodiment of the present disclosure. As shown in FIG. 3, the temperature sensor 30 may comprise a switch circuit 310, a charge/discharge circuit 320, a sensing circuit 330, and an oscillation circuit 340.

In the embodiment shown in FIG. 3, the switch circuit 310 may be a transistor $T_{SW}$, or more specifically a TFT transistor $T_{SW}$. However, it can be understood by those skilled in the art that the switch circuit 310 is not limited thereto, and it may also be other devices for switching, such as a relay, a thyristor and the like. In addition, the switch circuit 310 may also be a more complex analog/digital circuit and is not limited to a single element. For simplicity of description, the sensor according to the embodiment of the present disclosure will be described in detail below by taking the switch circuit 310 being a TFT transistor $T_{SW}$ as an example, but the present disclosure is not limited thereto.

As shown in FIG. 3, the switch circuit 310 may have an input terminal (for example, a source of the $T_{SW}$) connected to a power supply $V_{dd}$, and an output terminal (for example, a drain of the $T_{SW}$) connected to a first terminal (an upper electrode of C2) of the charge/discharge circuit 320 and an input terminal of the oscillation circuit 340. In addition, the switch circuit 310 may have a control terminal (for example, a gate of the $T_{SW}$) connected to an output terminal of the oscillation circuit 340. In this way, the switch circuit 310 enters a turn-on state when an output (an oscillation signal) of the oscillation circuit 340 is at a high level. At this time, the power source $V_{dd}$ may charge the charge/discharge circuit 320 so that the charge/discharge circuit 320 is charged to a high level. Similarly, the switch circuit 310 enters a turn-off state when the output (the oscillation signal) of the oscillation circuit 340 is at a low level. At this time, the charge/discharge circuit 320 is no longer charged by the power supply $V_{dd}$. At this time, the charge/discharge circuit 320 may gradually be discharged through the sensing circuit 330 to a low level.

In the embodiment shown in FIG. 3, the charge/discharge circuit 320 may be a capacitor C2. However, it can be understood by those skilled in the art that the charge/discharge circuit 320 may also be a more complicated analog/digital circuit and is not limited to a single element. For example, the charge/discharge circuit 320 may also be a plurality of capacitors connected in parallel. For simplicity of description, the sensor according to the embodiment of the present disclosure will be described in detail below by taking the charge/discharge circuit 320 being the capacitor C2 as an example, but the present disclosure is not limited thereto.

As shown in FIG. 3, the charge/discharge circuit 320 may have a first terminal (for example, the upper electrode of C2) connected to an output terminal (for example, a drain of the $T_{SW}$) of the switch circuit 310, and the other terminal (a second terminal or a lower electrode) connected to the ground. In this way, the charge/discharge circuit 320 may periodically be charged and discharged under control of both the switch circuit 310 and the oscillation circuit 340.

In the embodiment shown in FIG. 3, the oscillator circuit 340 may be a circuit formed by connecting five inverters in series. However, it can be understood by those skilled in the art that the oscillation circuit 340 may also be other circuits for generating an oscillation signal, such as a circuit formed by connecting an odd number of inverters in series or any other circuit for generating an oscillation signal. However, it should be illustrated that as the temperature sensor 30 in the embodiment shown in FIG. 3 detects a temperature by detecting an oscillation frequency of the oscillation signal (at, for example, $V_{out}$), the oscillation circuit 340 should be a passive oscillation circuit capable of generating a corresponding oscillation signal according to an input signal at the input terminal, instead of a self-oscillation element capable of outputting a signal having a fixed oscillation frequency. In addition, the oscillation circuit 340 may also be a more complicated analog/digital circuit, and is not limited to a circuit formed by connecting an odd number of inverters in series. For simplicity of description, the sensor according to the embodiment of the present disclosure will be described in detail below by taking the oscillation circuit 340 being a circuit formed by connecting five inverters in series as an example; however, the present disclosure is not limited thereto. In addition, although capacitance C1 is shown in FIG. 3, it is only parasitic capacitance of the oscillation circuit 340 composed of five inverters, which will not be described in detail herein.

As shown in FIG. 3, the input terminal of the oscillation circuit 340 may be connected to the output terminal of the switch circuit 310 (for example, the drain of the $T_{SW}$) and the first terminal (for example, the upper electrode) of the charge/discharge circuit. Optionally, the input terminal of the oscillation circuit 340 may also be connected to an input terminal (for example, a source of $T_{sense}$) of the sensing circuit 330. In addition, the output terminal of the oscillation circuit 340 may be connected to the control terminal (for example, the gate of the $T_{SW}$) of the switch circuit 310. As described above, the switch circuit 310 is turned on or turned off under control of the oscillation circuit 340. However, the input terminal of the oscillation circuit 340 is also connected to the charge/discharge circuit 320, and thus a charge-discharge cycle is formed.

Figure 5:
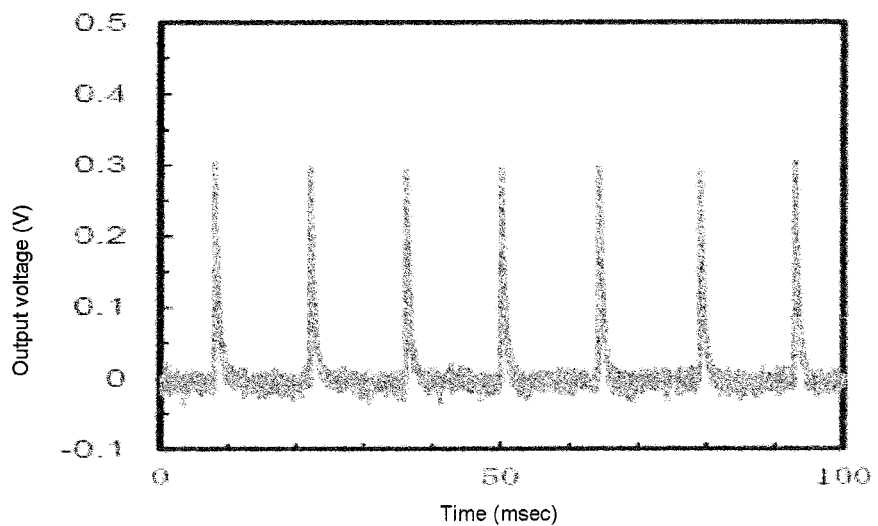
FIG. 5 is an exemplary diagram illustrating an output voltage of a sensor according to an embodiment of the present disclosure.

In a charge period, the switch circuit 310 is turned on under control of an output high level signal of the oscillation circuit 340, and thus the charge/discharge circuit 320 is charged by the power supply $V_{dd}$. When the first terminal of the charge/discharge circuit 320 reaches a certain high level, under action of the inverters (which are five inverters connected in series) of the oscillation circuit 340, the first terminal of the charge/discharge circuit 320 becomes a low level signal at the output terminal of the oscillation circuit 340. Thereby, the switch circuit 310 becomes turned off and enters a discharge period. In the discharge period, the charge/discharge circuit 320 is discharged through the sensing circuit 330, and when the first terminal of the charge/discharge circuit 320 reaches a certain low level, under action of the inverters (which are five inverters connected in series) of the oscillation circuit 340, the first terminal of the charge/discharge circuit 320 becomes a high level signal at the output terminal of the oscillation circuit 340. Thereby, the switch circuit 310 becomes turned on to enter to the charge period again, and so on. In this charge-discharge cycle, the output terminal $V_{out}$ of the oscillation circuit 340 may output a periodic oscillation signal. For example, FIG. 5 illustrates an oscillation signal which may be detected at the output terminal $V_{out}$ of the oscillation circuit 340 shown in FIG. 3.

In the embodiment shown in FIG. 3, the sensing circuit 330 may be a transistor $T_{sense}$, or more specifically a TFT transistor $T_{sense}$. However, it can be understood by those skilled in the art that the sensing circuit 330 is not limited thereto, and it may also be other devices for changing electrical properties according to a temperature, such as a thermistor and the like. At this time, the circuit design needs to be changed correspondingly. In addition, the sensing circuit 330 may also be a more complex analog/digital circuit and is not limited to a single element. For simplicity of description, the sensor according to the embodiment of the present disclosure will be described in detail below by taking the sensing circuit 330 being a TFT transistor $T_{sense}$ as an example; however, the present disclosure is not limited thereto.

As shown in FIG. 3, the input terminal (for example, the source of $T_{sense}$) of the sensing circuit 330 may be connected to the first terminal (for example, the upper electrode of C2) of the charge/discharge circuit 320. Optionally, the input terminal of the sensing circuit 330 may also be connected to the input terminal of the oscillation circuit 310 and/or the output terminal (for example, the drain of the $T_{SW}$) of the switch circuit 310. In addition, the output terminal (for example, the drain of $T_{sense}$) of the sensing circuit 330 may be connected to the ground, and the control terminal (for example, the gate of $T_{sense}$) of the sensing circuit 330 may be connected to a fixed voltage. In the embodiment shown in FIG. 3, the fixed voltage may be a voltage between a turn-on voltage and a turn-off voltage of the TFT transistor $T_{sense}$. In this case, when the charge/discharge circuit 320 is in the discharge period, a discharge speed (or discharge current) thereof may be associated with leakage current of the TFT transistor $T_{sense}$. As described above, a threshold voltage of the TFT transistor $T_{sense}$ may shift due to a temperature, thereby further affecting the leakage current. In this case, as the temperature of the sensing circuit 330 changes, the discharge speed of the charge/discharge circuit 320 also changes, thereby causing the oscillation frequency of the oscillation signal of the oscillation circuit 340 to change.

In addition, the temperature sensor 30 may further comprise a separate frequency detection circuit. The frequency detection circuit may be connected to the output terminal $V_{out}$ of the oscillation circuit 340 and may be configured to detect the oscillation frequency of the oscillation signal thereof so as to determine the temperature of $T_{sense}$ accordingly.

In addition, in some embodiments, both the switch circuit 310 and the sensing circuit 330 may be implemented by TFTs, so that the production process of the sensor 30 can be fully compatible with the production process of the TFT LCD, thus simplifying the production flow, and reducing the production time and production cost.

Figure 4:
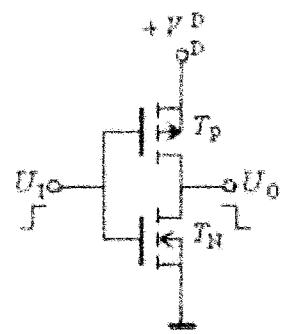
FIG. 4 is an exemplary schematic diagram illustrating an inverter used in the sensor shown in FIG. 3.

FIG. 4 is an exemplary schematic diagram illustrating an inverter used in the sensor 30 shown in FIG. 3. As shown in FIG. 4, the inverter used in the oscillation circuit 340 of FIG. 3 may also be made of TFTs, thereby further enhancing the compatibility with the production process of the TFT LCD.

In the example shown in FIG. 4, the inverter may consist of two different types of transistors, one of which is a P-enhanced transistor $T_P$, and the other of which an N-enhanced transistor $T_N$. As shown in FIG. 4, a gate-source turn-on voltage of $T_N$ is positive, and a gate-source turn-on voltage of $T_P$ is negative. When an input UI is at a low level, $T_N$ is turned off. At this time, $T_P$ is turned on and has very low internal resistance, and thus an output $U_O$ is at a high level. In contrast, when the input $U_I$ is at a high level, $T_N$ is turned on. At this time, $T_P$ is turned off, and thus the output $U_O$ is at a low level.

With the TFT-based inverter shown in FIG. 4, the compatibility with the production process of the TFT LCD can be further enhanced.

Figure 6:
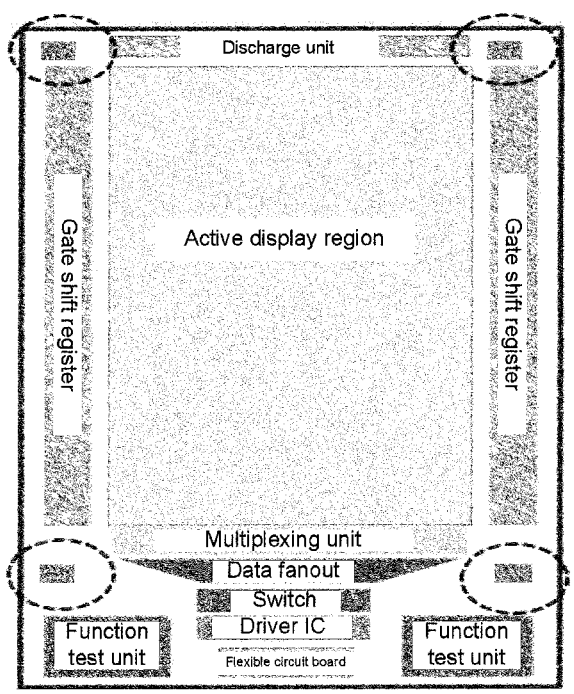
FIG. 6 is a diagram illustrating a hardware arrangement of a display apparatus according to an embodiment of the present disclosure.

Next, an exemplary hardware arrangement of a TFT LCD comprising the temperature sensor according to the embodiment of the present disclosure will be described in detail with reference to FIG. 6. FIG. 6 is a diagram illustrating a hardware arrangement of a display apparatus according to an embodiment of the present disclosure. As shown in FIG. 6, a temperature sensor according to an embodiment of the present disclosure may be designed at a non-display area position (for example, a position indicated by a dashed circle in FIG. 6) of a panel backplane so as not to affect normal display. In addition, although four temperature sensors are shown in FIG. 6, a number of temperature sensors may also be set as needed.

Figure 7:
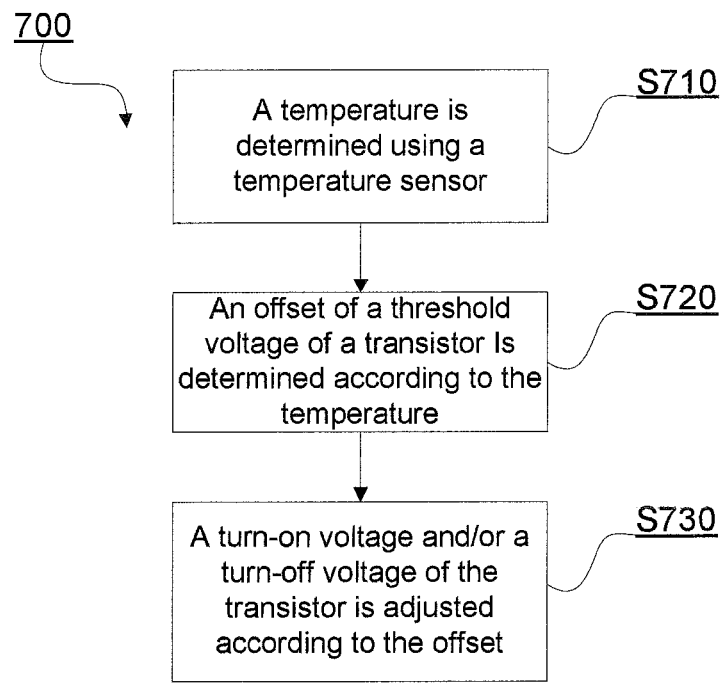
FIG. 7 is a flowchart illustrating an exemplary method for controlling a turn-on voltage and/or a turn-off voltage of a transistor according to an embodiment of the present disclosure.

FIG. 7 is a flowchart illustrating a method 700 for adjusting a turn-on voltage and/or a turn-off voltage of a transistor according to an embodiment of the present disclosure. As shown in FIG. 7, the method 700 may comprise steps S710, S720, and S730. According to the present disclosure, some steps of the method 700 may be performed individually or in combination and may be performed in parallel or sequentially, and is not limited to a specific operation order shown in FIG. 7. The method 700 according to the embodiment of the present disclosure will be described in detail below.

The method 700 starts at step S710 in which a temperature may be determined using the sensor according to the embodiment of the present disclosure. However, the present disclosure is not limited thereto. In fact, the temperature may also be determined using other sensors which are conventional or will be developed in the future.

In step S720, an offset of a threshold voltage of a transistor may be determined according to the determined temperature. For example, a correspondence table between temperatures and offsets of threshold voltages may be determined according to experimental data, and in a case that the temperature is detected, the offset of the threshold voltage is determined by looking up the correspondence table. In addition, the offset of the threshold voltage may also be determined based on the temperature according to, for example, an empirical formula or other means.

In step S730, a turn-on voltage and/or a turn-off voltage of the corresponding transistor may be adjusted according to the offset of the threshold voltage. For example, $V_{gh}$ and $V_{gl}$ are adjusted to increase or decrease as a whole to adapt to the shifted threshold voltage without increasing a voltage margin of $V_{gh}$ and $V_{gl}$. For example, in the above-mentioned example where the actual $V_{gh}$ is generally set to 12V and the actual $V_{gl}$ voltage is generally set to −12V, after the voltage adjustment solution according to the embodiment of the present disclosure is adopted, whether the threshold voltage is specifically increased or decreased may be determined according to a change in the temperature, and thus $V_{gh}$ may be set to, for example, 12V and $V_{gl}$ may be set to, for example, −8V, or −4V which is even lower. In this way, the power consumption of the TFT is reduced.

Heretofore, the temperature sensor, the array substrate and display apparatus comprising the sensor and the corresponding voltage adjustment method according to the embodiments of the present disclosure have been described in detail in conjunction with FIGS. 1 to 7. Thus, a temperature sensor manufactured on a display screen may be provided, which is used to monitor a temperature on the display screen, and is used to adjust a driving voltage in real time so as to achieve the purpose of reducing the power consumption. In addition, the production process of the sensor is fully compatible with the panel backplane process, and can be integrated on the panel, thereby simplifying the production process, saving production time and reducing production cost.

The present disclosure has heretofore been described in connection with the preferred embodiments. It should be understood that various other changes, substitutions and additions can be made by those skilled in the art without departing from the spirit and scope of the present disclosure. Therefore, the scope of the present disclosure is not limited to the specific embodiments described above, but should be defined by the appended claims.

In addition, functions described herein as being implemented by pure hardware, pure software, and/or firmware can also be implemented by dedicated hardware, a combination of general hardware and software and the like. For example, functions described as being implemented by dedicated hardware (for example, Field Programmable Gate Array (FPGA), Application Specific Integrated Circuit (ASIC) and the like) can be implemented by general purpose hardware (for example, Central Processing Unit (CPU), Digital Signal Processor (DSP)). a combination of software and software etc., and vice versa.

We claim:

1. A sensor for detecting a temperature, comprising:
a switch circuit;
a charge/discharge circuit connected to the switch circuit, and configured to be charged and discharged under control of the switch circuit;
a sensing circuit connected to the charge/discharge circuit, and configured to cause a charge/discharge period of the charge/discharge circuit to change with a temperature of the sensing circuit; and an oscillation circuit connected to the switch circuit and the charge/discharge circuit, and configured to generate, under action of the charge/discharge circuit, an oscillation signal for controlling the switch circuit, wherein an oscillation frequency of the oscillation signal is dependent on the charge/discharge period and thus indicates the temperature of the sensing circuit;

wherein the charge/discharge circuit has a first terminal and a second terminal, the first terminal of the charge/discharge circuit is connected to the output terminal of the switch circuit, the input terminal of the oscillation circuit, and the first terminal of the sensing circuit, and the second terminal of the charge/discharge circuit is connected to the ground.

2. The sensor according to claim 1, wherein the switch circuit has an input terminal, an output terminal and a control terminal, the input terminal of the switch circuit is connected to a power supply, the output terminal of the switch circuit is connected to a first terminal of the charge/discharge circuit, a first terminal of the sensing circuit and an input terminal of the oscillation circuit, and a control terminal of the switch circuit is connected to an output terminal of the oscillation circuit.

3. The sensor according to claim 2, wherein the switch circuit at least comprises a thin film transistor.

4. The sensor according to claim 1, wherein the oscillation circuit has an input terminal and an output terminal, the input terminal of the oscillation circuit is connected to the output terminal of the switch circuit, the first terminal of the charge/discharge circuit and a first terminal of the sensing circuit, and the output terminal of the oscillation circuit is connected to the control terminal of the switch circuit.

5. The sensor according to claim 4, wherein the oscillation circuit comprises an odd number of inverters connected in series.

6. The sensor according to claim 5, wherein the inverters are made of thin film transistors.

7. The sensor according to claim 1, wherein the sensing circuit has a first terminal, a second terminal and a control terminal, the first terminal of the sensing circuit is connected to the output terminal of the switch circuit, the first terminal of the charge/discharge circuit, and the input terminal of the oscillation circuit, the second terminal of the sensing circuit is connected to the ground, and the control terminal of the sensing circuit is connected to a predetermined voltage.

8. The sensor according to claim 7, wherein the sensing circuit at least comprises a thin film transistor.

9. The sensor according to claim 8, wherein the predetermined voltage is between a turn-on voltage and a turn-off voltage of the thin film transistor.

10. The sensor according to claim 1, further comprising:
a frequency detection circuit connected to the output terminal of the oscillation circuit, and configured to detect the oscillation frequency of the oscillation signal so as to determine the temperature.

11. An array substrate comprising the sensor according to claim 10.

12. A display apparatus comprising the sensor according to claim 10.

13. An array substrate comprising the sensor according to claim 1.

14. A display apparatus comprising the sensor according to claim 1.

15. A method for adjusting a driving voltage of a transistor, comprising:
determining a temperature using the sensor according to claim 1;
determining an offset of a threshold voltage of the transistor according to the temperature; and
adjusting the driving voltage of the transistor according to the offset,
wherein the driving voltage is at least one of a turn-on voltage and/or a turn-off voltage.

16. An array substrate comprising the sensor according to claim 1.

17. The sensor according to claim 1, wherein the charge/discharge circuit at least comprises a capacitor.

18. A display apparatus comprising the sensor according to claim 1.

19. A method for adjusting a driving voltage of a transistor, comprising:
determining a temperature using the sensor according to claim 1;
determining an offset of a threshold voltage of the transistor according to the temperature; and
adjusting the driving voltage of the transistor according to the offset,
wherein the driving voltage is at least one of a turn-on voltage and/or a turn-off voltage.

* * * * *